United States Patent [19]
Arai et al.

[11] Patent Number: 5,291,065
[45] Date of Patent: Mar. 1, 1994

[54] SEMICONDUCTOR DEVICE AND METHOD OF FABRICATING SEMICONDUCTOR DEVICE

[75] Inventors: Kiyoshi Arai; Hirofumi Omachi, both of Fukuoka, Japan

[73] Assignee: Mitsubishi Denki Kabushiki Kaisha, Tokyo, Japan

[21] Appl. No.: 990,199

[22] Filed: Dec. 14, 1992

[30] Foreign Application Priority Data

Dec. 16, 1991 [JP] Japan ..................... 3-331829

[51] Int. Cl.[5] ............... H01L 23/16; H01L 39/02
[52] U.S. Cl. ........................ 257/723; 257/724; 257/691
[58] Field of Search ............ 257/691, 692, 693, 700, 257/723, 724, 725, 728, 762, 763, 764, 770; 333/247

[56] References Cited
U.S. PATENT DOCUMENTS
4,920,405  4/1990  Itoh et al. ..................... 257/724

FOREIGN PATENT DOCUMENTS
53-145065  12/1978  Japan .
57-15452   1/1982   Japan ..................... 257/724
57-159033  10/1982  Japan .
63-244654  10/1988  Japan ..................... 257/724

Primary Examiner—Sheila V. Clark
Attorney, Agent, or Firm—Oblon, Spivak, McClelland, Maier & Neustadt

[57] ABSTRACT

A patterned first metal plate (310) is joined to an upper surface of a first ceramic substrate (301), and a second metal plate (330) is joined to an emitter electrode (310E) of the first metal plate (310) through a second ceramic substrate (320). Power devices (4) are mounted on a collector electrode (310C) of the first metal plate (310), and control devices (5) are mounted on the second metal plate (330). The emitter electrode (310E) of a metal layer lies between a high-voltage circuit having the first metal plate (310) and power devices (4) and a control (low-voltage) circuit having the control devices (5) and second metal plate (330). The emitter electrode (310E) serves as a shielding material, and the electrostatic shielding effect prevents noises applied to the high-voltage circuit from being led to the control circuit, so that the faulty operations of the control devices (5) are prevented and the reliability of the semiconductor device is improved.

20 Claims, 14 Drawing Sheets

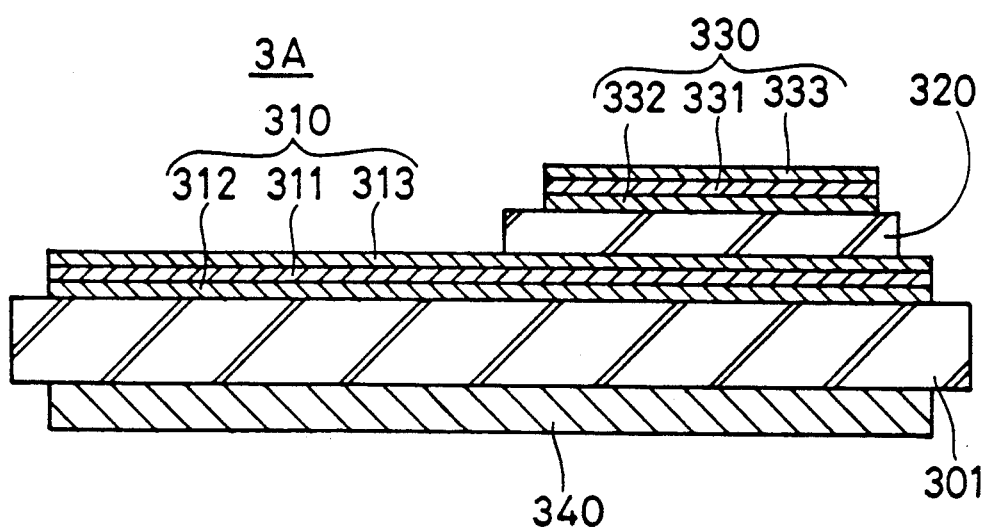
F I G . 1 1

SEMICONDUCTOR DEVICE AND METHOD OF FABRICATING SEMICONDUCTOR DEVICE

BACKGROUND OF THE INVENTION

1. Field of the Invention

The present invention relates to a semiconductor device including power semiconductor devices and control semiconductor devices for controlling the power semiconductor devices and a method of fabricating the semiconductor device. The invention also relates to a composite substrate for use in the semiconductor device and a method of fabricating the composite substrate.

2. Description of the Background Art

FIG. 13 is a cross-sectional view of a conventional semiconductor power module, and FIG. 14 is a schematic cross-sectional view of a composite substrate for use in the power module. The power module 100 includes a composite substrate (insulating substrate) 110 on a copper base plate 101, as shown in FIG. 13. The composite substrate 110 includes a ceramic substrate 111 and copper plates 112 and 113 joined respectively to both surfaces of the ceramic substrate 111, as shown in FIG. 14. The copper plate 112 is patterned to the configurations of electronic circuits to be formed thereon so that it is separated into a first region 112a and a second region 112b. power semiconductor devices (referred to as "power devices" hereinafter) 103 used under high voltage and high-current conditions are mounted in the first region 112a, as shown in FIG. 13, so that a high-voltage circuit is formed. Control semiconductor devices (referred to as "control devices" hereinafter) 104 used under low-voltage and low-current conditions and for controlling the power devices 103 are mounted in the second region 112b (See FIG. 14). so that a control circuit (low-voltage circuit) is formed.

Referring to FIG. 13, an outsert case 130 having first and second connecting terminals 131 and 132 is bonded at its end portion 133 to the copper base plate 101. This permits the outsert case 130 to accommodate the composite substrate 110, power devices 103 and control devices 104. A first connecting terminal portion 131a connected electrically to the first connecting terminals 131 is soldered to the first region 112a of the copper plate 112, so that the first connecting terminals 131 and the power devices 103 are connected electrically to each other. A second connecting terminal portion 132a connected electrically to the second connecting terminals 132 is soldered to the second region 112b, so that the second connecting terminals 132 and the control devices 104 are connected electrically to each other The lower portion of the interior of the outsert case 130 is filled with silicon gel 141, and the upper portion thereof is filled with epoxy resin 142.

In the power module 100, when a control signal is applied to the control devices 104 through the second connecting terminals 132, a signal from the control devices 104 is applied to the power devices 103 to control the drive of the power devices 103. This provides for the drive control of a load circuit (not shown) connected electrically to the power devices 103 through the first connecting terminals 131.

Since both of the high-voltage circuit and the control circuit are disposed on the single ceramic substrate 111 in the conventional power module 100, there is formed a capacitance between the high-voltage circuit and the control circuit through the ceramic substrate 111. When noises are produced in the high-voltage circuit due to external factors such as load fluctuation, the noises are led to the control circuit through the capacitance in the ceramic substrate 111 to cause the faulty operations of the control devices 104. There arises a problem that the power devices 103 also faultily operate, resulting in deterioration of the reliability of the power module 100.

SUMMARY OF THE INVENTION

According to the present invention, a semiconductor device comprises: (a) a metal base plate, (b) a composite substrate mounted on the metal base plate, the composite substrate including: (b-1) a first ceramic substrate joined onto the metal base plate, (b-2) a first metal plate joined to an upper surface of the first ceramic substrate and formed into a predetermined pattern, the first metal plate having first and second regions arranged parallel to the upper surface of the first ceramic substrate, (b-3) a second ceramic substrate joined to an upper surface of the first region of the first metal plate, and (b-4) a second metal plate joined to an upper surface of the second ceramic substrate and formed into a predetermined pattern. The semiconductor device further comprises: (c) a power semiconductor device mounted on an upper surface of the second region of the first metal plate, and (d) a control semiconductor device mounted on an upper surface of the second metal plate for controlling the power semiconductor device, at least the second region of the first metal plate including: (b-3-1) a first metal layer joined to the upper surface of the first ceramic substrate, (b-3-2) a second metal layer bonded onto the first metal layer, and (b-3-3) a third metal layer bonded onto the second metal layer, the second metal layer being lower in coefficient of thermal expansion than the first and third metal layers, the first region of the first metal plate being an electrode layer to be held at a constant potential.

Preferably, an operation reference electrode of the power semiconductor device is connected electrically to the first region.

In another aspect of the present invention, the semiconductor device comprises: (a) a metal base plate, (b) a composite substrate mounted on the metal base plate, the composite substrate including: (b-1) first ceramic substrate joined onto the metal base plate, (b-2) a first metal plate joined to an upper surface of the first ceramic substrate and formed into a predetermined pattern, the first metal plate having first and second regions arranged parallel to the upper surface of the first ceramic substrate, (b-3) a second ceramic substrate joined to an upper surface of the first region of the first metal plate, and (b-4) a second metal plate joined to an upper surface of the second ceramic substrate and formed into a predetermined pattern. The semiconductor device further comprises: (c) a power semiconductor device mounted on an upper surface of the second region of the first metal plate, and (d) a control semiconductor device mounted on an upper surface of the second metal plate for controlling the power semiconductor device, at least the second region of the first metal plate including: (b-3-1) a first metal layer joined to the upper surface of the first ceramic substrate, (b-3-2) a second metal layer bonded onto the first metal layer, and (b-3-3) a third metal layer bonded onto the second metal layer, the second metal layer being lower in coefficient of thermal expansion than the first and third metal layers.

In the semiconductor device of the present invention, the first region made of metal is interposed between the second region on which the power semiconductor device is mounted and the second metal plate on which the control semiconductor device is mounted. The first region functions as a shielding material, and the electrostatic shielding effect prevents noises applied to the second region of the first metal plate from being led to the second metal plate. Therefore, the faulty operations of the control semiconductor device are prevented, and the reliability of the device is improved.

Since the intermediate layer of the second region is the metal layer having the low coefficient of thermal expansion, the metal layer functions as a binding member for the second region in a heat cycle. A difference in coefficient of thermal expansion between the second region and the first ceramic substrate is decreased, resulting in decreasing thermal stress applied to the first ceramic substrate. Such a noise leading prevention effect is securely achieved without cracks in the ceramic substrates.

In particular, by holding the first region at a constant potential, potential fluctuation in the first region is substantially zero. The noises in the second region are securely intercepted.

The first region held at the constant potential may be used as the operation reference electrode of the power semiconductor device.

The present invention is also intended for a method of fabricating a semiconductor device. According to the present invention, the method comprises the steps of: (a) providing a composite substrate having first to third metal plates and first and second ceramic substrates, the third metal plate of its upper surface, the first ceramic substrate and the first metal plate being put in this order and joined together. The first metal plate in a predetermined region of its upper surface, the second ceramic substrate and the second metal plate being put in this order and joined together, the first metal plate having a first region specifying the predetermined region and a second region, at least the second region including a first metal layer joined to an upper surface of the first ceramic substrate, a second metal layer bonded onto the first metal layer, and a third metal layer bonded onto the second metal layer, the second metal layer being lower in coefficient of thermal expansion than the first and third metal layers, (b) joining a lower surface of the third metal plate to an upper surface of a metal base plate, (c) fixing a power semiconductor device on an upper surface of the second region of the first metal plate, and (d) fixing a control semiconductor device for controlling the power semiconductor device on an upper surface of the second metal plate.

In the method of fabricating the semiconductor device according to the present invention, the fabrication processes for the semiconductor device are specified, so that the semiconductor device having the foregoing characteristics is fabricated.

The present invention is also intended for a composite substrate for use in a semiconductor device. According to the present invention, the composite substrate comprises: (a) a first ceramic substrate, (b) a first metal plate joined to an upper surface of the first ceramic substrate and having first and second regions arranged parallel to the upper surface of the first ceramic substrate, (c) a second ceramic substrate joined onto the first region of the first metal plate, (d) a second metal plate joined to an upper surface of the second ceramic substrate, and (e) a third metal plate joined to a lower surface of the first ceramic substrate, at least the second region of the first metal plate including: (b-1) a first metal layer, (b-2) a second metal layer bonded onto the first metal layer, and (b-3) a third metal layer bonded onto the second metal layer, the second metal layer being lower in coefficient of thermal expansion than the first and third metal layers.

The composite substrate of the present invention is employable in the fabrication of the semiconductor device.

The present invention is also intended for a method of fabricating a composite substrate for use in a semiconductor device. According to the present invention, the method comprises the steps of: (a) providing a first metal plate which is a multilayer metal plate formed into a predetermined pattern, the multilayer metal plate having a first metal layer, a second metal layer joined onto the first metal layer, and a third metal layer joined onto the second metal layer, the second metal layer being lower in coefficient of thermal expansion than the first and third metal layers, (b) joining a lower surface of the first metal plate to an upper surface of a first ceramic substrate, (c) joining a second ceramic substrate to a predetermined region of an upper surface of the first metal plate, (d) joining a second metal plate formed into a predetermined pattern to an upper surface of the second ceramic substrate, and (e) joining a third metal plate to a lower surface of the first ceramic substrate.

In another aspect of the present invention, the method of fabricating the composite substrate for use in the semiconductor device, comprises the steps of: (a) providing a multilayer metal plate having a first metal layer, a second metal layer bonded onto the first metal layer, and a third metal layer bonded onto the second metal layer, the second metal layer being lower in coefficient of thermal expansion than the first and third metal layers, (b) joining the multilayer metal plate to an upper surface of a first ceramic substrate and forming the multilayer metal plate into a predetermined pattern by etching to form a first metal plate, (c) joining a metal film to an upper surface of a second ceramic substrate and forming the metal film into a predetermined pattern by etching to form a second metal plate, (d) joining the second ceramic substrate to a predetermined region of an upper surface of the first metal plate, and (e) joining a third metal plate to a lower surface of the first ceramic substrate.

In the method of fabricating the composite substrate for use in the semiconductor device according to the present invention, the fabrication processes of the composite substrate are specified, so that the foregoing composite substrate is fabricated.

It is a primary object of the present invention to provide a very reliable semiconductor device which prevents a control device from faulty operations. For provision of such a novel semiconductor device, in particular, the present invention is intended to achieve the primary object, taking care not to cause a new problem such as cracks made in a ceramic substrate.

It is another object of the present invention to provide a method of fabricating a semiconductor device which accomplishes the primary object.

It is still another object of the present invention to provide a composite substrate which increases the reliability of a semiconductor device when used for the semiconductor device.

It is a further object of the present invention to provide a method of fabricating a composite substrate which accomplishes the third object.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a schematic cross-sectional view of the composite substrate according to another preferred embodiment of the present invention;

DESCRIPTION OF THE PREFERRED EMBODIMENTS

Construction of Device of First Preferred Embodiment

Figure 1:
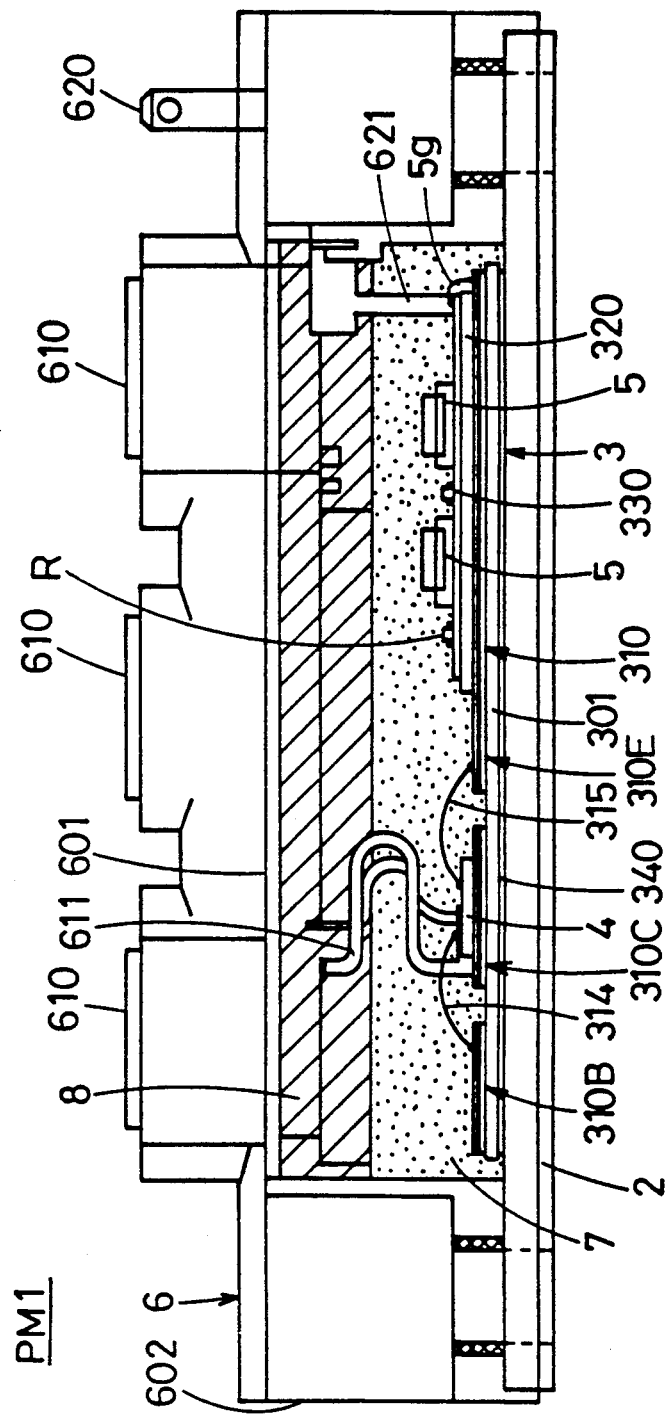
FIG. 1 is a cross-sectional view of a semiconductor device according to a first preferred embodiment of the present invention.
Figure 2:
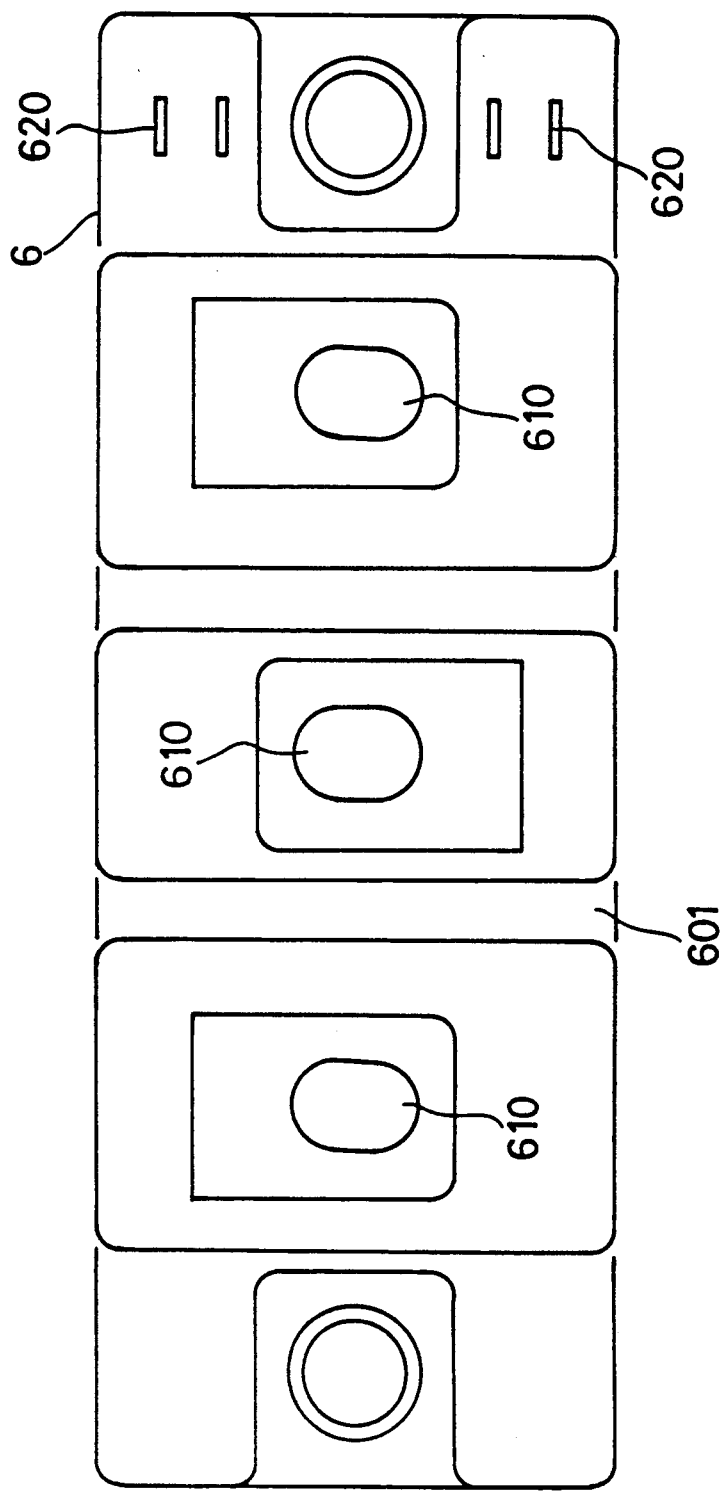
FIG. 2 is a plan view of the semiconductor device of the first preferred embodiment.

FIG. 1 is a cross-sectional view of a semiconductor device (power module) PM1 according to a first preferred embodiment of the present invention, and FIG. 2 is a plan view thereof. The power module PM1 comprises a composite substrate 3 mounted on a copper base plate 2. The composite substrate 3 includes a first ceramic substrate 301; a third metal plate 340 joined to the lower surface of the first ceramic substrate 301; a first metal plate 310 which is a composite metal plate (multilayer metal plate) joined to the upper surface of the ceramic substrate 301; a second ceramic substrate 320 joined to the upper surface of the first metal plate 310; and a second metal plate 330 joined onto the second ceramic substrate 320. Power devices 4 and control devices 5 are disposed on the composite substrate 3. These elements are held in an outsert case 6. A semifinished device (wire bonding completed product) including the copper base plate 2, composite substrate 3, power devices 4 and control devices 5 is shown in cross section in FIG. 3 and in plan view in FIG. 4. FIG. 5 is a schematic cross-sectional view of the composite substrate 3.

The composite substrate 3 will be discussed in detail hereinafter with reference to FIGS. 3 and 5. The first ceramic substrate 301 forming the composite substrate 3 is made of ceramic having, for example, alumina ($Al_2O_3$) or aluminum nitride (AlN) as a base material.

The first metal plate 310 is soldered to the upper surface of the first ceramic substrate 301. The first metal plate 310 is the composite metal plate (multilayer metal plate) formed such that two copper plates 312 and 313 and a molybdenum plate 311 fitted therebetween are joined together. The first metal plate 310 is patterned to the configurations of electronic circuits to be formed thereon (See FIGS. 3 and 4) so that it is separated into a base electrode 310B, an emitter electrode 310E and a collector electrode 310C.

Figure 3:
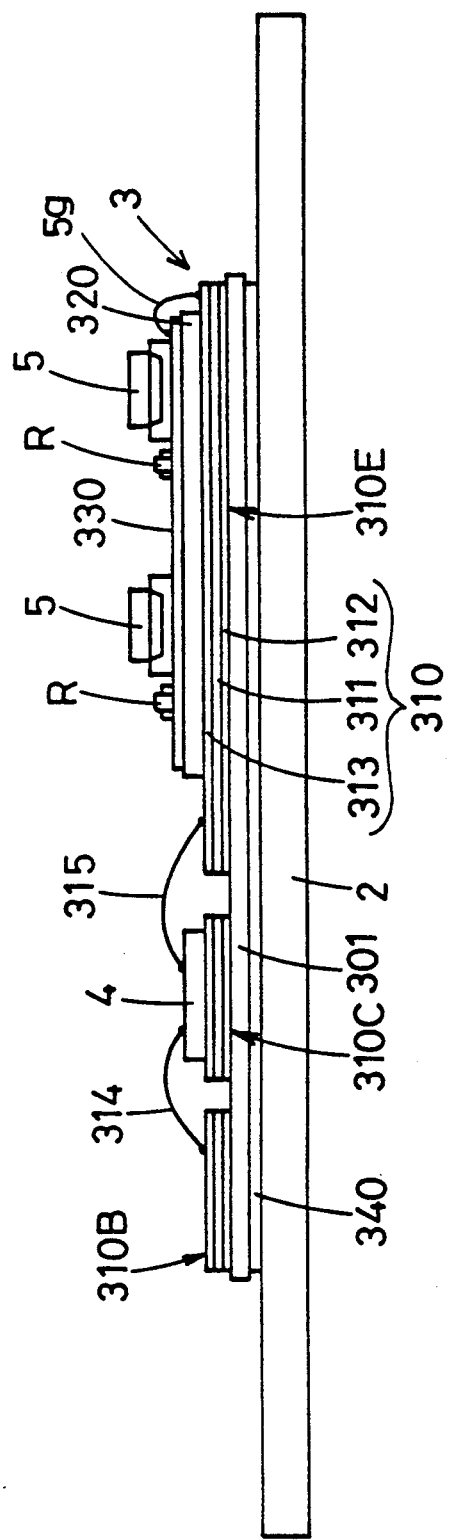
FIG. 3 is a side view of a major part of the semiconductor device of the first preferred embodiment.
Figure 4:
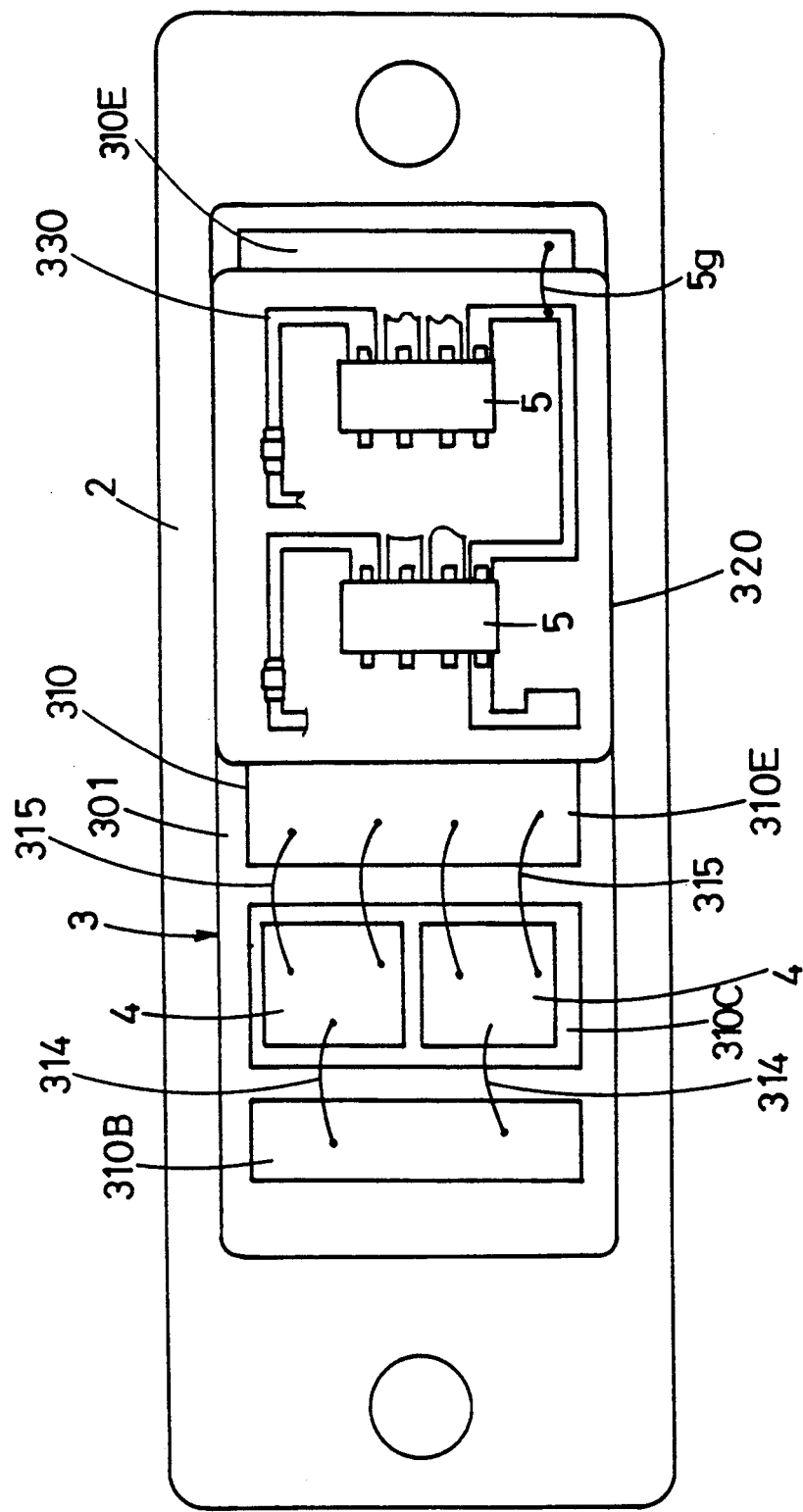
FIG. 4 is a plan view of the major part of the semiconductor device of the first preferred embodiment.
Figure 5:
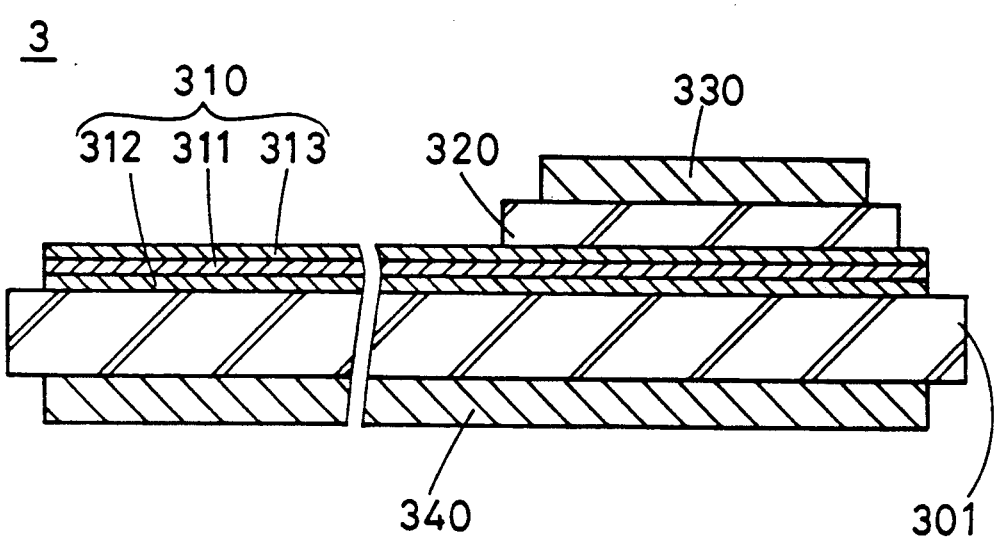
FIG. 5 is a schematic cross-sectional view of a composite substrate for use in the semiconductor device of the first preferred embodiment.

As shown in FIGS. 3 and 4, the plurality of power devices 4 are fixed by soldering to the collector electrode 310C of the first metal plate 310. The power devices 4 are, for example, power transistors. Each of the power devices 4 has a collector region formed on its lower surface. The collector regions are connected electrically to the collector electrode 310C through the solder. Each of the power devices 4 also has a base region and an emitter region formed on its upper surface. The base regions are connected electrically to the base electrode 310B by aluminium wires 314 and the emitter regions are connected electrically to the emitter electrode 310E by aluminium wires 315.

The second ceramic substrate 320 made substantially of the same material as the first ceramic substrate 301 is joined by soldering onto part of the first metal plate 310 which is corresponding to the emitter electrode 310E.

The second metal plate 330 made of copper or copper alloy is joined by soldering onto the second ceramic substrate 320. The second metal plate 330 is patterned to the configuration of an electronic circuit to be formed thereon.

The third metal plates 340 made of copper or copper alloy is joined by soldering to the lower surface of the first ceramic substrate 301.

The lower surface of the third metal plate 340 is joined by soldering onto the copper base plate 2 serving as a heat sink.

The plurality of control devices 5 for controlling the power devices 4 and passive devices including resistive elements R are fixed by soldering in a predetermined region of the second metal plate 330, respectively. The control devices 5 are integrated circuits (ICs) that operate on a lower voltage than the voltage on which the power devices 4 operate.

An aluminium wire 5g electrically connects the earth terminals of the control devices 5 to the emitter electrode 310E. The output terminals of the control devices 5 are connected electrically to the base electrode 310B through a conducting path not shown. The conducting path is, for example, an aluminium wire or a through hole passing through the second ceramic substrate 820.

Referring again to FIGS. 1 and 2, the outsert case 6 includes a cylindrical side wall portion 602 and a lid portion 601 bonded to the top end of the side wall portion 602. The bottom end of the side wall portion 602 is bonded to the end of the copper base plate 2 with adhesives. This permits the outsert case 6 to accommodate the composite substrate 3, power devices 4 and control devices 5.

A plurality of first electrode terminals 610 and a plurality of second electrode terminals 620 are mounted on the lid portion 601 of the outsert case 6. A first connecting terminal portion 611 connected electrically to the first connecting terminals 610 is mounted on the lower surface of the lid portion 601. The bottom end of the first connecting terminal portion 611 is connected by soldering to the collector electrode 310C of the first metal plate 310. This permits the collector regions of the power devices 4 to be connected electrically to the first electrode terminals 610 through the collector electrode 310C and first connecting terminal portion 611. A second connecting terminal portion 621 connected electrically to the second electrode terminals 620 is also mounted on the lower surface of the lid portion 601. The bottom end of the second connecting terminal portion 621 is connected by soldering to a predetermined region of the second metal plate 330. This permits the input terminals of the control devices 5 to be connected electrically to the second electrode terminals 620 through the second connecting terminal portion 621.

The lower half of the interior of the outsert case 6 is filled with silicon gel 7, and the upper half thereof is filled with epoxy resin 8. The silicon gel 7 and epoxy resin 8 thus seal the composite substrate 3, power devices 4, control devices 5 and first and second connecting terminal portions 611 and 621.

Figure 6:
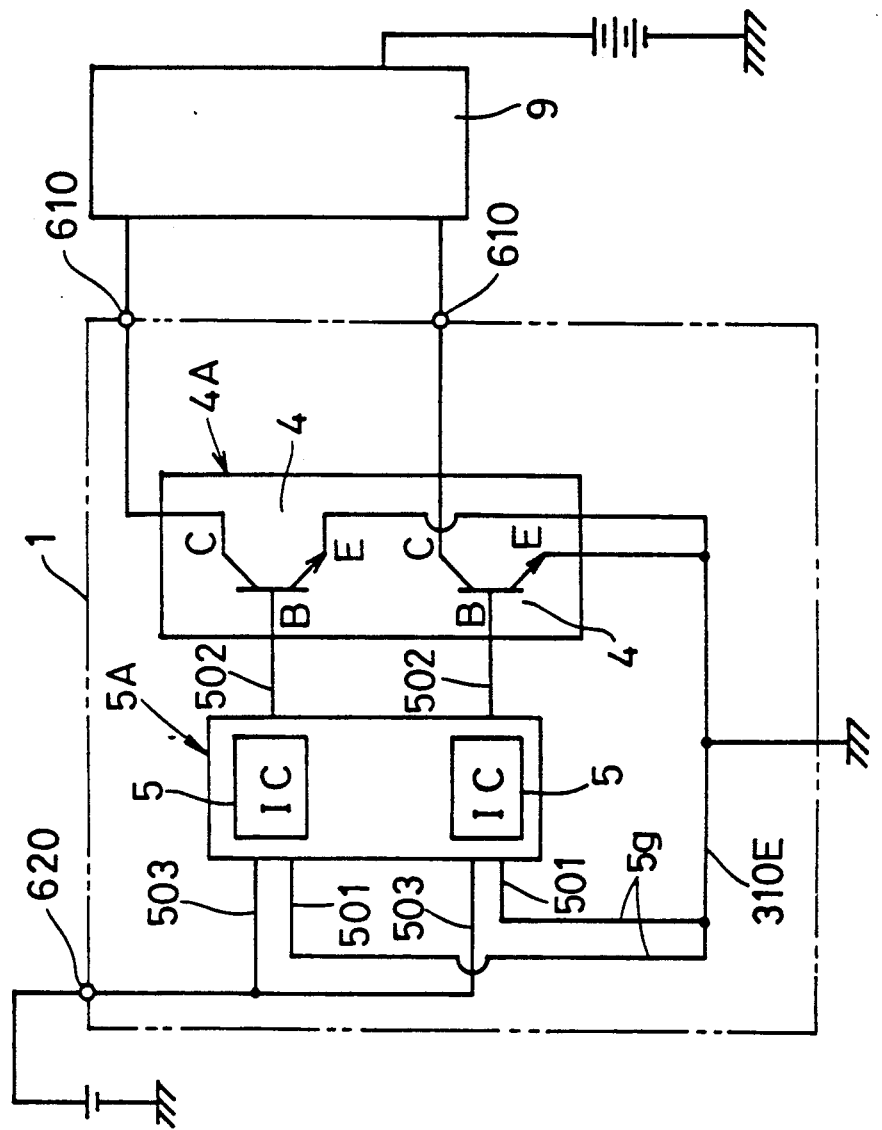
FIG. 6 is an equivalent circuit diagram of the semiconductor device of the first preferred embodiment.

FIG. 6 is an equivalent circuit diagram of an example of the power module PM1. Earth terminals 501 and output terminals 502 of the control devices 5 forming a control circuit 5A are connected to emitters E and bases B of the power devices 4, respectively. Power supply terminals 503 of the control devices 5 are connected to an external low-voltage power source. The power devices 4 forming a power circuit 4A are operated in response to an output signal from the control circuit 5A to vary a main current flowing from a load circuit 9 to an external high voltage power source.

Characteristics and Operation of Device

In the composite substrate 3 of the power module PM1, there is formed a capacitance between the high-voltage circuit including the power devices 4 and the low-voltage circuit (control circuit) including the control devices 5 through the first and second ceramic substrates 301 and 320. The power module PM1. However, is adapted such that the composite metal layer composed of the emitter electrode 310E, which is grounded, lies between the high-voltage circuit and control circuit. The emitter electrode 310E functions as a shielding material, and noises produced in the high-voltage circuit are prevented from being led to the control circuit by the shielding effect. Therefore, the faulty operations of the control devices 5 are prevented, and the reliability of the device is improved.

The first metal plate 310 of the first preferred embodiment is the composite metal plate having the two copper plates 312 and 313 and the molybdenum plate 311 fitted therebetween. The coefficient of thermal expansion of the molybdenum plate 311 ($3.0 \times 10^{-6}$ to $4.0 \times 10^{-6}$ /degree) is lower than that of the copper plates 312 and 313 ($16.5 \times 10^{-6}$ /degree).

The molybdenum plate 311 serves as a binding material for the copper plates 312 and 313 in a heat cycle while the module PM1 is in operation. A difference in thermal expansion between the first metal plate 310 and the first and second ceramic substrates 301, 320 (having the coefficient of thermal expansion of $5.0 \times 10^{-6}$ /degree) can be decreased in the heat cycle. As a result, the thermal stress applied to the first and second ceramic substrates 301 and 320 is decreased, so that cracks are prevented from being made in the first and second ceramic substrates 301 and 320.

When the number of layers in the composite substrate 3 is increased as in the power module PM1 of the first preferred embodiment. The transfer path of eat diffusing vertically in a section from the second ceramic substrate 320 to the heat sink (or the copper base plate 2) is relatively long. While the power module PM1 is in operation, almost all heat is generated from the high-voltage circuit having the power devices 4, and the control circuit having the control devices 5 generates a small amount of heat. Since the high-voltage circuit is not formed on the second ceramic substrate 320 but on the first ceramic substrate 301 in the power module PM1 of the first preferred embodiment, the transfer path of heat generated from the high-voltage circuit is not so long in the vertical direction. For this reason, a heat dissipating performance from the high-voltage circuit is not deteriorated. Although the transfer path of heat diffusing vertically from the control circuit is relatively long, only a small amount of heat is generated from the control circuit. Hence, heat dissipation from the control circuit is not a problem.

Method of Fabricating Composite Substrate 3

The composite substrate 3 may be fabricated in either first or second mode described later. In the first mode, the plate members of the composite substrate 3 are patterned by punching and are then joined together. In the second mode, the plate members of the composite substrate 3 are joined together and are then patterned by etching.

For the fabrication of the composite substrate 3 in the first mode are prepared the first and second ceramic substrates 301, 302, the molybdenum plate 311 and copper plates 312, 313 of the first metal plate 310, and the second and third metal plates 330, 340

The molybdenum plate 311 and copper plates 312, 313 are formed into a predetermined pattern by punching (pressing). The second metal plate 330 is also formed into a predetermined pattern by punching. The third metal plate 340 is formed into a predetermined configuration by punching.

The third metal plate 340, first ceramic substrate 301, copper plate 312, molybdenum plate 311, copper plate 313, second ceramic substrate 320 and second metal plate 330 are put together in this order, with hard solder fitted therebetween respectively. While these plate members are put in a jig for positioning, the hard solder is heated to be melted and solidified. The composite substrate 3 is thus formed.

In this example, the composite substrate 3 and the lamination of the first metal plate 310 are formed at the same time. The composite substrate 3, however, may be fabricated such that the molybdenum plate 311 and copper plates 312, 313 are joined together to form the first metal plate 310 and, subsequently, the first metal plate 310 is joined to the other plate members.

Specifically, the composite substrate 3 is fabricated in the latter case as described below. The molybdenum plate 311 and copper plates 312, 313 which are patterned respectively by punching are put together, with hard solder fitted therebetween respectively. The hard solder is melted and solidified, to form the first metal plate 310.

After the first metal plate 310 is prepared in this manner, the third metal plate 340, first ceramic substrate 301, first metal plate 310, second ceramic substrate 320 and second metal plate 330 are put together in this order, with hard solder fitted therebetween respectively. While the position of the plate members are fixed by means of the jig, the hard solder is heated to be melted and solidified, whereby the plate members are joined together.

Alternatively, The first metal plate 310 may be formed by producing a multilayer metal plate having two rectangular copper plates and a rectangular molybdenum plate fitted therebetween and, subsequently, patterning the multilayer metal plate by punching. The plate members of the composite substrate 3 may be sequentially joined.

The method of fabricating the composite substrate 3 in the second mode will be described below. The first copper plate 312, molybdenum plate 311 and second copper plate 313 are put together on the first ceramic substrate 301 of rectangular configuration, with brazing filler metal fitted therebetween. They are heated to be joined together. The first copper plate 312, molybdenum plate 311 and second copper plate 313 on the first ceramic substrate 301 are etched to be formed into a predetermined pattern, so that the first metal plate 310 is formed. Alternatively, the first metal plate 310 may be formed such that a prepared multilayer metal plate having rectangular copper plates and a rectangular molybdenum plate fitted therebetween is joined onto the first ceramic substrate 301 with hard solder and is etched.

Next, a rectangular copper plate is joined onto the second ceramic substrate 320 of rectangular configuration with hard solder. The copper plate is etched to be formed into a redetermined pattern, so that the second metal plate 330 is formed.

The second metal plate 330 and second ceramic substrate 320 are joined onto the first metal plate 310 with hard solder.

The third metal plate 340 of rectangular configuration is formed on the lower surface of the first ceramic substrate 301, so that the composite substrate 3 is provided.

In the first mode, since the plate members of the composite substrate 3 are formed into the predetermined patterns by punching, relatively thick metal plates are used for production of the composite substrate 3. In particular, the composite substrate 3 suitable for use under high-current conditions is formed in the first mode.

In the second mode, since tho plate members are formed into the predetermined patterns by etching, minute patterns are easily provided. The second mode is advantageous in that it is suitable for side reduction and integration of the module.

Method of Fabricating Power Module PM1

Description will be given on a method of fabricating the power module PM1 using the composite substrate 3 thus fabricated.

Initially, solder is applied to the upper surface of the copper base plate 2.

Figure 7:
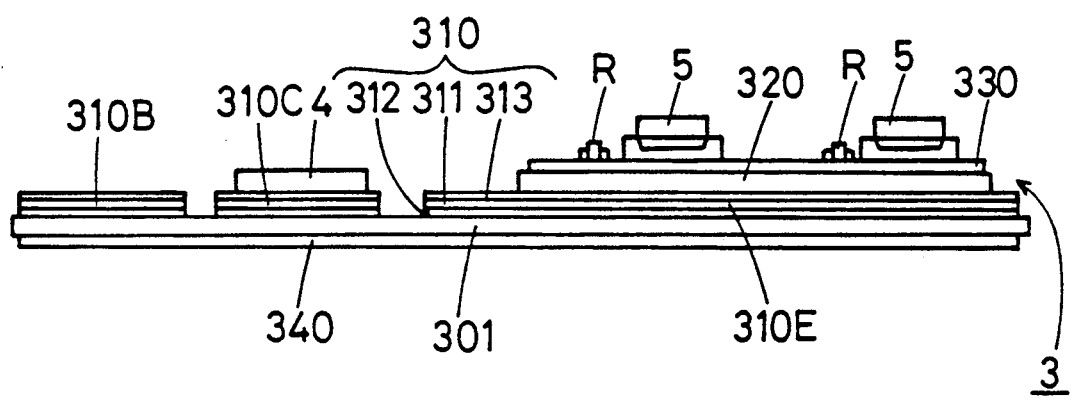
FIGS. 7 and 8 are side views illustrating fabrication processes of the semiconductor device of the first preferred embodiment, respectively.

With reference to FIG. 7, the power devices 4, control devices 5 and resistive elements R are mounted in position on the composite substrate 3 through solders, respectively.

Figure 8:
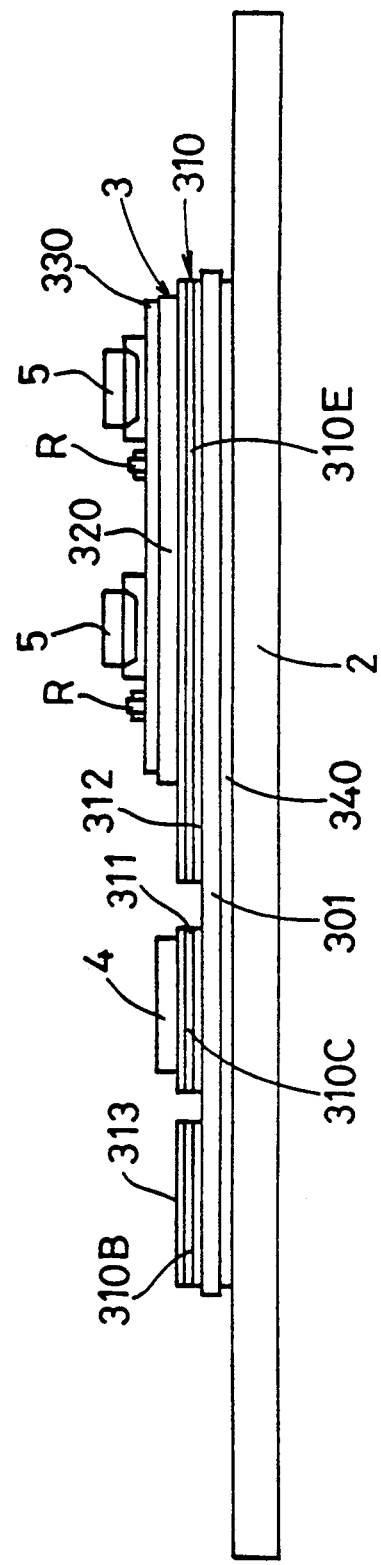

The composite substrate 3 of FIG. 7 is placed on the copper base plate 2 to which the solder is applied, so that the structure of FIG. 8 is provided.

Heat is applied to the semifinished module of FIG. 8 to melt and solidify the respective solders. This allows the copper base plate 2, composite substrate 3, power devices 4, control devices 5 and resistive elements R to be bonded together. The semifinished module in this stage is referred to as a "base assembly completed product." It should be noted that the power devices 4 which are designed to resist high temperatures are not denatured by the heat for melting solders. The control devices 5 are also designed to generally resist heat up to about 200° C. Heat deterioration does not occur in the control devices 5 at a temperature up to which the solders are heated to be melted.

The wires 314 and 315 are bonded to the base assembly completed product, to thereby form the wire bonding completed product shown in FIG. 3.

Solder is selectively applied to the upper surfaces of the first and second metal plates 310, 330 of the composite substrate 3. Adhesive is applied to the bottom end portion of the outsert case 6. The outsert case 6 is put over the wire bonding completed product. The outsert case 6 is bonded to the copper base plate 2 with the adhesive, and the first and second connecting terminal portions 611, 621 are soldered to the first and second metal plates 310, 330. The bonding step is executed while heat is applied.

Flux used for soldering is washed off. The silicon gel 7 is poured into the outsert case 6, and heating cure is carried out with an oven. The epoxy resin 8 is poured into the remaining space in the outsert case 6, and similar heating cure is carried out with the oven. This completes the assembly of the power module PM1 of FIG. 1.

Second Preferred Embodiment

Figure 9:
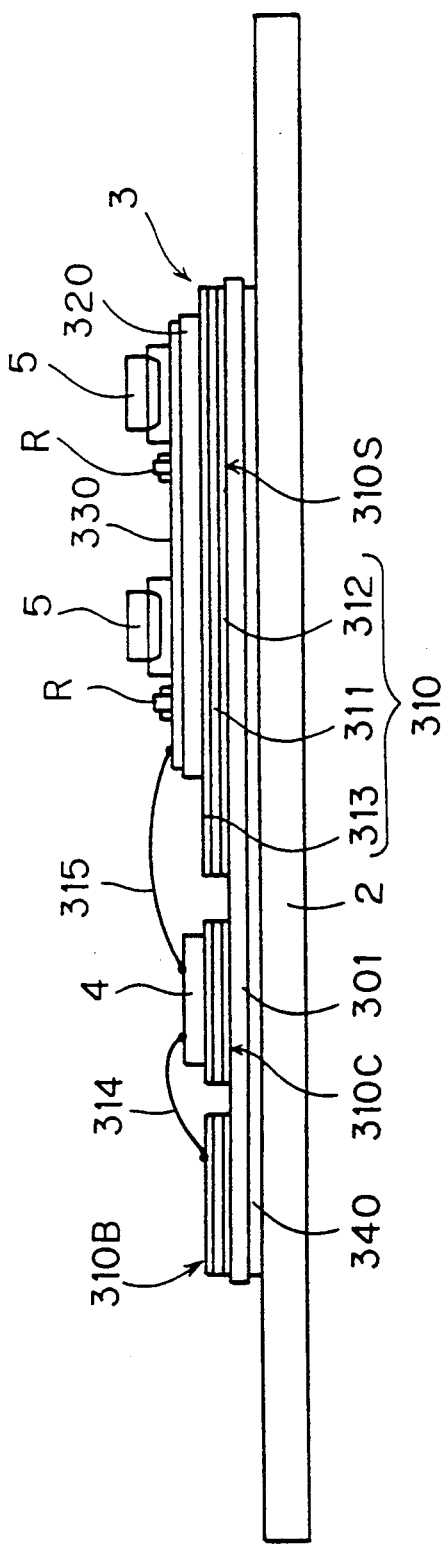
FIG. 9 is a side view of the major part of the semiconductor device according to a second preferred embodiment of the present invention.

FIG. 9 shows the wire bonding completed product of a power module PM2 according to a second preferred embodiment of the present invention. The wire bonding completed product of FIG. 9 in the second preferred embodiment is corresponding to that of FIG. 3 in the first preferred embodiment.

In the power module PM2, part of the patterned second metal plate 330 serves as the emitter electrode. The emitter electrode is connected electrically to the emitter regions of the power devices 4 by the aluminium wires 315, and to the earth terminals of the control devices 5 by the conducting path. In this case, a shielding region 310S of the first metal plate 310 may be floating or be connected to arbitrary circuit points.

The other constructions of the power module PM2 are similar to those of the power module PM1.

The power module PM2 includes the shielding region 310S made of metal between the high-voltage circuit and control circuit. The shielding effect of the shielding region 310S prevents the noises produced in the high-voltage circuit from being led to the control circuit. Therefore, the faulty operations of the control devices 5 are prevented, and the reliability of the device is improved.

Third Preferred Embodiment

Figure 10:
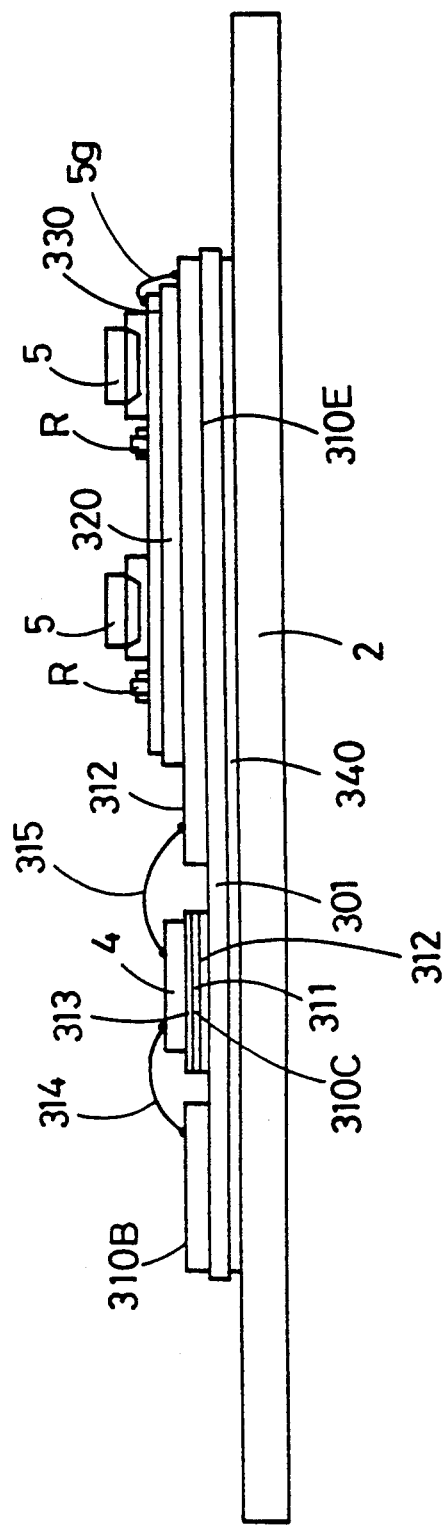
FIG. 10 is a side view of the major part of the semiconductor device according to a third preferred embodiment of the present invention.

FIG. 10 shows the wire bonding completed product of a power module PM3 according to a third preferred embodiment of the present invention. The power module PM3 includes, above the first ceramic substrate 301, the base and emitter electrodes 310B and 310E of a single-layer copper plate and the collector electrode 310C of a multilayer metal plate having the two copper plates 312, 313 and the molybdenum plate 311 fitted therebetween.

The Other constructions of the power module PM3 are similar to those of the power module PM1 of the first preferred embodiment.

The power module PM3 effectively prevents the cracks caused from the thermal stress.

As above described, the main heat source of the power module PM3 is the high-voltage circuit having the power devices 4, and the molybdenum plate 311 of the multilayer metal plate serves as the binding member for the copper plates 312, 313 in the heat cycle The power module PM3 is designed such that only the collector region 310C under the high-voltage circuit is the multilayer metal plate, whereby the problem of the thermal stress is substantially eliminated. When the other regions 310B and 310E are an inexpensive single-layer copper plate, cost reduction is achieved.

Variations of Composite Substrate

Figure 12:
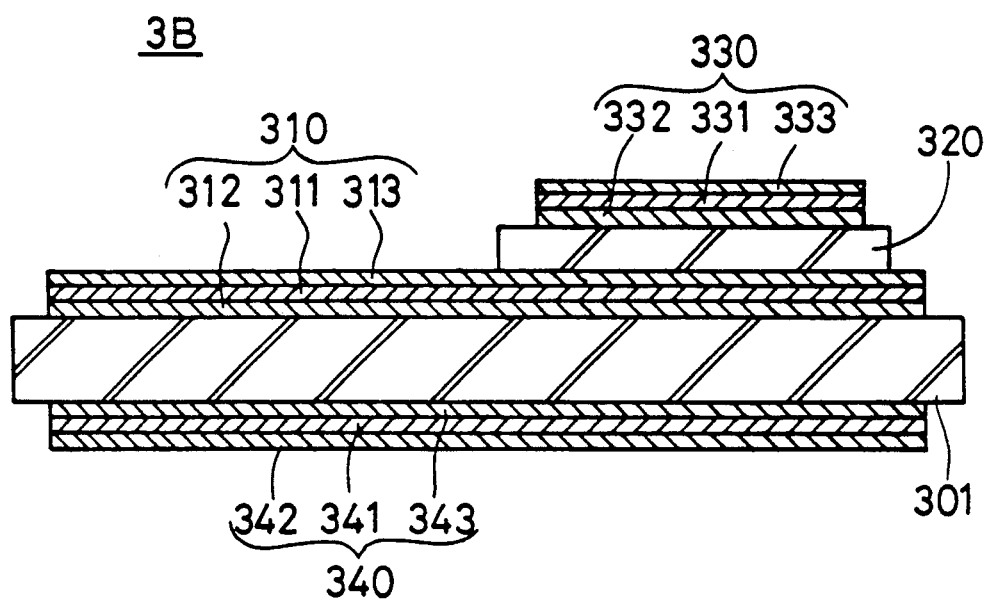
FIG. 12 is a schematic cross-sectional view of the composite substrate according to still another preferred embodiment of the present invention.
Figure 13:
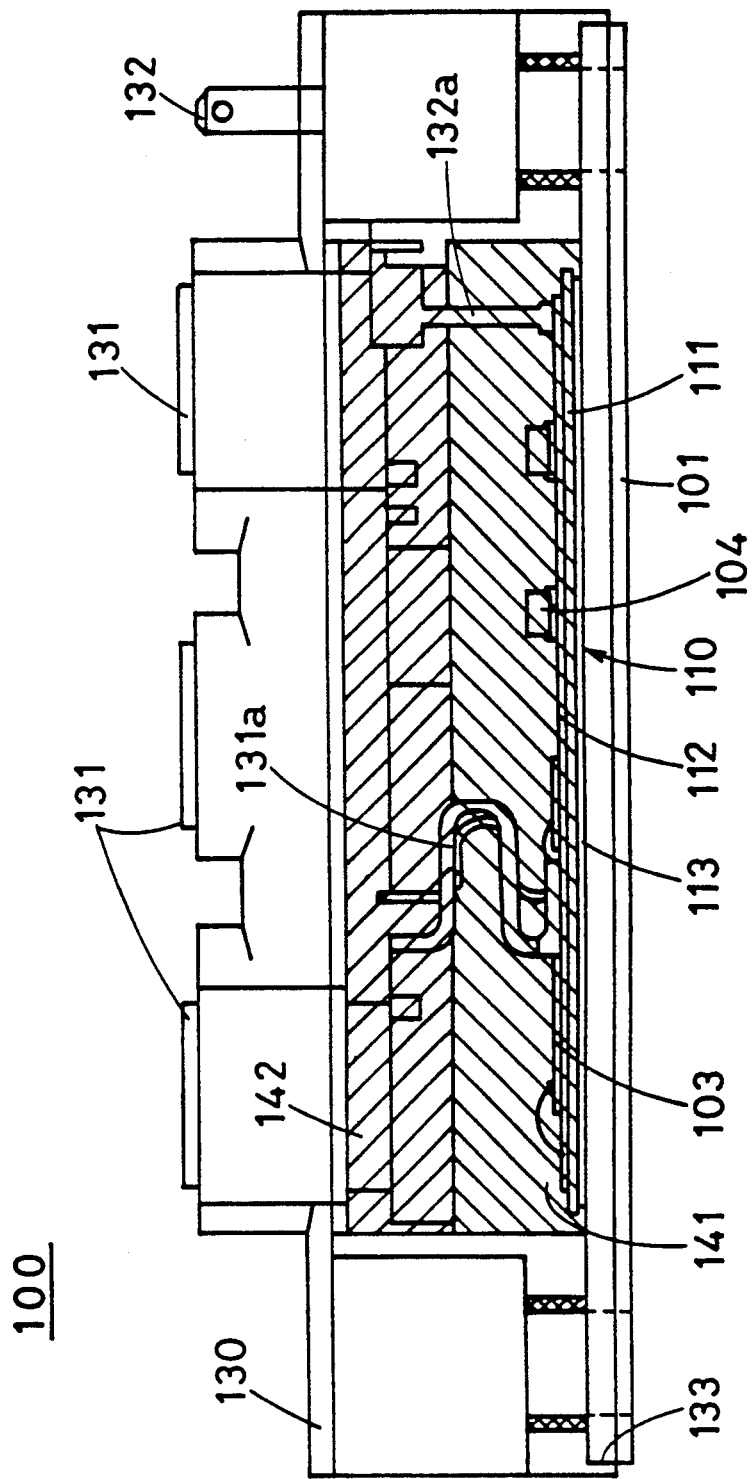
FIG. 13 is a cross-sectional view of a conventional semiconductor device.
Figure 14:
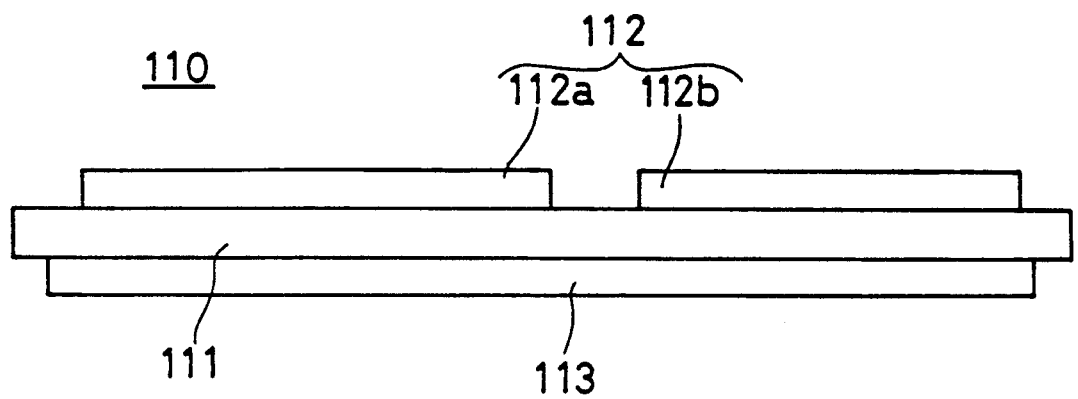
FIG. 14 is a schematic cross-sectional view of a composite substrate for use in the conventional semiconductor device.

Composite substrates 3A and 3B shown respectively in FIGS. 11 and 12 may be used for the power module.

The second metal plate 330 on which the control devices are to be mounted is a multilayer metal plate similar to the first metal plate 310 in the composite substrate 3A of FIG. 11. That is, the second metal plate 330 is formed such that two copper plates 332, 333 and a molybdenum plate 331 fitted therebetween are joined together, and is patterned to the configuration of the electronic circuit.

The other constructions of the composite substrate 3A are similar to those of the composite substrate 3 of FIG. 5.

In the power module having the composite substrate 3A, the molybdenum plate 331 serves as a binding member for the copper plates 332, 333 in the heat cycle. This enables a difference in thermal expansion to decrease between the second metal plate 330 and second ceramic substrate 320. As a result, the thermal stress applied to the second ceramic substrate S20 is further decreased.

In the composite substrate 3B of the second variation shown in FIG. 12, the third metal plate 340 to be joined to the lower surface of the first ceramic substrate 301 is formed such that two copper plates 342, 343 and a molybdenum plate 341 fitted therebetween are joined together.

The other constructions of the composite substrate 3B are similar to those of the composite substrate 3A.

In the power module having the composite substrate 3B, the molybdenum plate 341 serves as a binding member for the copper plates 342, 343 in the heat cycle. As a result, the thermal stress applied to the first ceramic substrate 301 is further decreased.

Similarly to the composite substrate 3, the composite substrates 3A and 3B may be fabricated by joining the respective patterned metal plates together, or by patterning a lamination of the plurality of rectangular metal plates and the plurality of ceramic plates.

In the preferred embodiments, the molybdenum plates 311, 331, 341 are used as the binding members for the first to third metal plates 310, 330, 340. Molybdenum alloy plates, tungsten plates or tungsten alloy plates may be used as the binding members. Copper alloy plates may be substituted for the copper plates 312, 313, 332, 333, 342, 343.

An insert case may be used in place of the outsert case 6.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   (a) a metal base plate,
   (b) a composite substrate mounted on said metal base plate,
   said composite substrate including:
   (b-1) a first ceramic substrate joined onto said metal base plate,
   (b-2) a first metal plate joined to an upper surface of said first ceramic substrate and formed into a predetermined pattern, said first metal plate having first and second regions arranged parallel to the upper surface of said first ceramic substrate,
   (b-3) a second ceramic substrate joined to an upper surface of said first region of said first metal plate, and
   (b-4) a second metal plate joined to an upper surface of said second ceramic substrate and formed into a predetermined pattern,
   said semiconductor device further comprising:
   (c) a power semiconductor device mounted on an upper surface of said second region of said first metal plate, and
   (d) a control semiconductor device mounted on an upper surface of said second metal plate for controlling said power semiconductor device,
   at least said second region of said first metal plate including:
   (b-3-1) a first metal layer joined to the upper surface of said first ceramic substrate,
   (b-3-2) a second metal layer bonded onto said first metal layer, and
   (b-3-3) a third metal layer bonded onto said second metal layer,
   said second metal layer being lower in coefficient of thermal expansion than said first and third metal layers,
   said first region of said first metal plate being an electrode layer to be held at a constant potential.

2. The semiconductor device of claim 1, wherein an operation reference electrode of said power semiconductor device is connected electrically to said first region.

3. The semiconductor device of claim 2, wherein said first region is an electrode layer to be grounded.

4. The semiconductor device of claim 3, wherein both of said first and second regions of said first metal plate have said first to third metal layers.

5. The semiconductor device of claim 2,
   wherein said first and third metal layers are made of copper or copper alloy, and
   wherein said second metal layer is made of molybdenum, tungsten, molybdenum alloy or tungsten alloy.

6. The semiconductor device of claim 5, further comprising:
   (e) a case for covering said composite substrate, said power semiconductor device and said control semiconductor device and bonded to said metal base plate, and (f) a sealing material filling the interior of said case for sealing said composite substrate, said power semiconductor device and said control semiconductor device.

7. The semiconductor device of claim 4, wherein said second metal plate includes:
(b-4-1) a fourth metal layer,
(b-4-2) a fifth metal layer bonded onto said fourth metal layer, and
(b-4-3) a sixth metal layer bonded onto said fifth metal layer, and
wherein said fifth metal layer is lower in coefficient of thermal expansion than said fourth and sixth metal layers.

8. The semiconductor device of claim 7, wherein said fourth and sixth metal layers are made of copper or copper alloy, and
wherein said fifth metal layer is made of molybdenum, tungsten, molybdenum alloy, or tungsten alloy.

9. The semiconductor device of claim 4, wherein said composite substrate further includes
(b-5) a third metal plate fitted between said first ceramic substrate and said metal base plate,
wherein said third metal plate includes:
(b-5-1) a seventh metal layer,
(b-5-2) an eighth metal layer bonded onto said seventh metal layer, and
(b-5-3) a ninth metal layer bonded onto said eighth metal layer, and
wherein said eighth metal layer is lower in coefficient of thermal expansion than said seventh and ninth metal layers.

10. The semiconductor device of claim 9, wherein said seventh and ninth metal layers are made of copper or copper alloy, and
wherein said eighth metal layer is made of molybdenum, tungsten, molybdenum alloy, or tungsten alloy.

11. The semiconductor device of claim 3, wherein said first region of said first metal plate is made of a substantially single metal.

12. The semiconductor device of claim 11, wherein said first region is made of copper or copper alloy.

13. A semiconductor device, comprising:
(a) a metal base plate,
(b) a composite substrate mounted on said metal base plate,
said composite substrate including:
(b-1) a first ceramic substrate joined onto said metal base plate,
(b-2) a first metal plate joined to an upper surface of said first ceramic substrate and formed into a predetermined pattern, said first metal plate having first and second regions arranged parallel to the upper surface of said first ceramic substrate,
(b-3) a second ceramic substrate joined to an upper surface of said first region of said first metal plate, and
(b-4) a second metal plate joined to an upper surface of said second ceramic substrate and formed into a predetermined pattern,
said semiconductor device further comprising:
(c) a power semiconductor device mounted on an upper surface of said second region of said first metal plate, and (d) a control semiconductor device mounted on an upper surface of said second metal plate for controlling said power semiconductor device,
at least said second region of said first metal plate including:
(b-3-1) a first metal layer joined to the upper surface of said first ceramic substrate,
(b-3-2) a second metal layer bonded onto said first metal layer, and
(b-3-3) a third metal layer bonded onto said second metal layer,
said second metal layer being lower in coefficient of thermal expansion than said first and third metal layers.

14. A composite substrate for use in a semiconductor device comprising:
(a) a first ceramic substrate,
(b) a first metal plate joined to an upper surface of said first ceramic substrate and having first and second regions arranged parallel to the upper surface of said first ceramic substrate,
(c) a second ceramic substrate joined onto said first region of said first metal plate,
(d) a second metal plate joined to an upper surface of said second ceramic substrate, and
(e) a third metal plate joined to a lower surface of said first ceramic substrate,
at least said second region of said first metal plate including:
(b-1) a first metal layer,
(b-2) a second metal layer bonded onto said first metal layer, and
(b-3) a third metal layer bonded onto said second metal layer,
said second metal layer being lower in coefficient of thermal expansion than said first and third metal layers.

15. The composite substrate of claim 14, wherein both of said first and second regions of said first metal plate have said first to third metal layers.

16. The composite substrate of claim 15, wherein said first and third metal layers are made of copper or copper alloy, and
wherein said second metal layer is made of molybdenum, tungsten, molybdenum alloy, or tungsten alloy.

17. The composite substrate of claim 14, wherein said second metal plate includes:
(d-1) a fourth metal layer,
(d-2) a fifth metal layer bonded onto said fourth metal layer, and
(d-3) a sixth metal layer bonded onto said fifth metal layer, and
wherein said fifth metal layer is lower in coefficient of thermal expansion than said fourth and sixth metal layers.

18. The composite substrate of claim 17, wherein said fourth and sixth metal layers are made of copper or copper alloy, and
wherein said fifth metal layer is made of molybdenum, tungsten, molybdenum alloy, or tungsten alloy.

19. The composite substrate of claim 17, wherein said third metal plate includes:
(e-1) a seventh metal layer,
(e-2) an eighth metal layer bonded onto said seventh metal layer, and (e-3) a ninth metal layer bonded onto said eighth metal layer, and wherein said eighth metal layer is lower in coefficient of thermal expansion than said seventh and ninth metal layers.

20. The composite substrate of claim 19, wherein said seventh and ninth metal layers are made of copper or copper alloy, and wherein said eighth metal layer is made of molybdenum, tungsten, molybdenum alloy, or tungsten alloy.

* * * * *